United States Patent [19]
Kalbitzer

[11] Patent Number: 4,764,432
[45] Date of Patent: Aug. 16, 1988

[54] PHOTO-MASK WITH REGIONS HAVING A DIFFERING OPTICAL TRANSMISSIVITIES

[75] Inventor: Siegfried Kalbitzer, Heidelberg, Fed. Rep. of Germany

[73] Assignee: Max Planck-Gesellschaft zur Förderung der Wissenschaften e.V., Gottingen, Fed. Rep. of Germany

[21] Appl. No.: 880,800

[22] Filed: Jul. 1, 1986

[30] Foreign Application Priority Data

Jul. 5, 1985 [DE] Fed. Rep. of Germany ....... 3524176

[51] Int. Cl.$^4$ .......................... B05D 3/06; B32B 9/04; G03F 9/00
[52] U.S. Cl. ..................................... 428/446; 427/35; 427/431; 427/162; 427/164; 428/195; 428/210; 428/212; 428/689; 428/702; 430/5; 430/275; 430/296; 430/308
[58] Field of Search .................... 430/5, 275, 276, 278, 430/308, 321, 296, 942, 945; 428/680, 702, 210, 446; 427/35, 43, 182, 162, 164

[56] References Cited

U.S. PATENT DOCUMENTS

| | | | |
|---|---|---|---|
| 4,315,782 | 2/1982 | Tarng | 148/1.5 |
| 4,339,285 | 7/1982 | Pankove | 148/1.5 |
| 4,388,400 | 6/1983 | Tabei et al. | 430/945 |
| 4,498,224 | 2/1985 | Maeguchi | 148/176 |

FOREIGN PATENT DOCUMENTS

| | | |
|---|---|---|
| 157248 | 9/1982 | Japan . |
| 1217169 | 12/1970 | United Kingdom . |

OTHER PUBLICATIONS

Brodsky, "Image Recording on Amorphous Films", IBM Tech. Discl., Jul. 1969, vol. 12, No. 2, p. 332.
Cho Lsi Gijutsu Kenkyu Kumiai, "Photomasks", Sep. 1981, Chem. Abstracts vol. 96, p. 640, No. 113548k.
Selenyi, "Production of pH. Images on Selenium", 1952, Chem. Abstracts vol. 47, No. 22, Nov. '53, #12 068B.
P. Chaudhari & S. R. Herd, "Electron-Beam Addr. Memory", Aug. 1973, IBM Tech. Discl. vol. 16, No. 3, p. 869.
Ast, Brodsky & Gutfeld, "Producing Microscopic Patterns", Mar. 1972, IBM Tech. Disc. vol. 14, No. 10, pp. 31, 33.
Ovshinsky, "Reversible H.S. Hi-Res. Imaging . . . .", Proceedings of the S.I.D., vol. 13/4, 1972, pp. 188-192.
Okuto, "Transfer Mask for Photo Exposure" 20 Nov. '80; Pat. Abs. of Japan vol. 4, No. 168 (P-37)[650].
Mizuno, "Mask", 24 Feb. '81; Pat. Abs. of Japan, vol. 5, No. 30 (E-47)[702].
Mitsushima, "Photomask", 19 Mar. 1983; Pat. Abs. of Japan, vol. 7, No. 67 (P-184)[1212].
S. M. Sze, "Physics of Semiconductor Devices", 1969, Wiley–Interscience, pp. 51–55.
D. T. Pierce and W. E. Spicer, "Electronic Structure of Amorphous Si from Photo–Emission and Optical Studies" Apr. 15, 1972, Physical Review B, vol. 5, No. 8, pp. 3017–3029.
"The Physics of Hydrogenated Amorphous Silicon II" edited by J. D. Joannopoulos & G. Lucovsky, 1984, Springer-Verlag, pp. 140–142.
P. Baeri, "Effect on Fast Solidification on Impurity Trapping and Amorphous Formation in Si", Oct. 1983, Journal de Physique pp. C5-157-C5-170.
"The Crystalline–toamorphous transition in ion-bombarded silicon", Philosophical Magazine B. 1980 vol. 41, No. 3–307-325.

Primary Examiner—George F. Lesmes
Assistant Examiner—James B. Monroe
Attorney, Agent, or Firm—Frishauf, Holtz, Goodman & Woodward

[57] ABSTRACT

A photomask useful as stencil or reticle comprises a thin layer, which includes regions of different optical transmissivity for light radiation of a predetermined spectral range. The layer consists of silicon or any other suitable semiconductor material, and the regions of different transmissivity consist essentially of the monocrystalline or amorphous phase of the mask material. The photomask may be manufactured by irradiating a thin layer of monocrystalline silicon with a focussed ion beam to convert the silicon within the irradiated regions into the amorphous phase.

9 Claims, 2 Drawing Sheets

PHOTO-MASK WITH REGIONS HAVING A DIFFERING OPTICAL TRANSMISSIVITIES

The present invention relates to photomasks including stencils and reticles, which are useful e. g. for the manufacture of semiconductor devices, such as integrated circuits, semiconductor memories, semiconductor imagers, by photolithographic techniques. The invention relates also to a method of manufacturing such a photomask.

BACKGROUND OF THE INVENTION

Photomasks are widely used for manufacturing semiconductor device, as integrated circuits, semiconductor memories, semiconductor imagers and the like. Photomasks of a size scaled up with respect to the final product are also known as reticles. Photomasks which have the same size as the final product and are widely used in photolithographic techniques, are also called 1:1 stencils.

The known photomasks are generally manufactured by a photolithographic technique wherein a metal film is selectively masked with a photoresist pattern and etched off, where the film is not protected by the photoresist. Such a technique comprises numerous method steps of which several are wet chemical steps, and is therefore relatively expensive and time-consuming.

SUMMARY OF THE INVENTION

It is an object of the invention to provide a photomask which can be easily and quickly manufactured without wet chemical steps.

A further object of the invention is to provide a photomask which can be provided with a pattern comprising structures with a size below one micron.

A photomask according to the invention comprises a layer made of a mask material, said layer having areas of different optical transmissivity. According to a preferred embodiment of the invention, the layer consists of silicon and the areas of different optical transmissivity consist essentially of monocrystalline and amorphous silicon, respectively.

More generally, any other semiconductor material than silicon may be used as mask material, such as germanium or an $A_{III}B_V$ compound semiconductor material; in fact any material with covalent bonds and a suitable energy band gap can be used as mask material, and the areas of different optical transmissivity may comprise different proportions of the crystalline and the amorphous phase of the mask material rather than consisting essentially of the one or the other phase of the mask material.

The mask layer is supported by a substrate which is transparent for the optical radiation with which the photomask is intended to be used.

Further, the invention provides a simple and quick method of manufacture of a photomask. with an appropriate starting material, the method according to the invention comprises a single method step only, and allows to produce very fine structures with dimensions down to the submicron range without any wet chemical process. In a preferred embodiment of the present method, a pattern comprising areas consisting essentially of amorphous silicon (a-Si) and areas consisting essentially of crystalline silicon (c-Si) is produced by exposing a monocrystalline silicon layer by means of a focussed ion beam. The radiation does necessary for producing a photomask according to the invention is less by a factor of about 100 than the does needed with electron-beam exposure of a photoresist layer.

DESCRIPTION OF PREFERRED EMBODIMENTS

Figure 1:
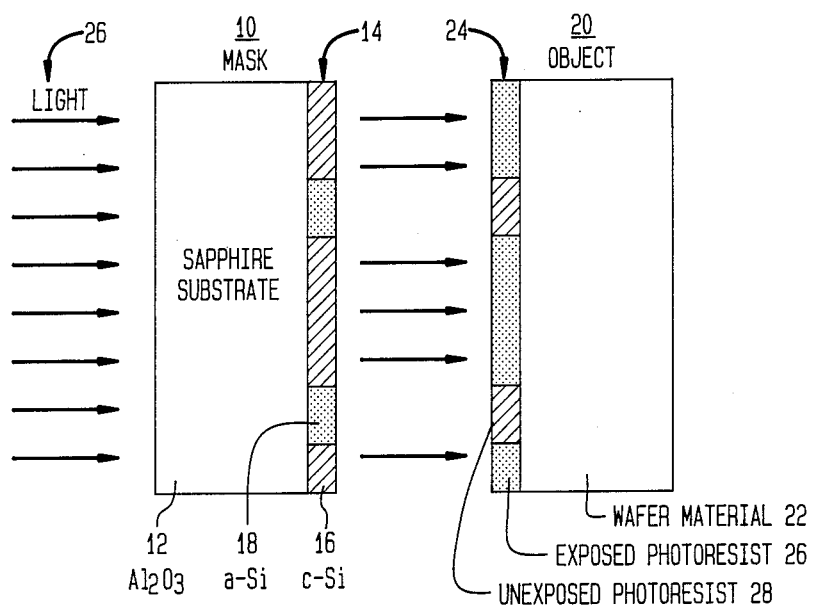
FIG. 1 is a simplified and enlarged sectional view of a photomask according to the invention and an object to be selectively exposed through said photomask.

In FIG. 1, a preferred embodiment of the present photomask 10 is shown adjacent to an object 20 in which a fine pattern is to be produced by a conventional process which involves projecting a collimated beam of light of predetermined energy or wavelength through the photomask 10 onto the object 20. The photomask 10 comprises a substrate 12 of monocrystalline sapphire ($Al_2O_3$), and a thin silicon layer 14 supported on a major surface of the substrate 12. The thickness of the layer 14 is about 0.1 microns. The silicon layer 14 comprises zones or regions 16 which consits essentially of crystalline silicon (c-Si), and zones or regions 18 which consist essentially of amorphous silicon (a-Si). The zones 16, 18 extend through the entire thickness of the silicon layer 14.

Figure 2:
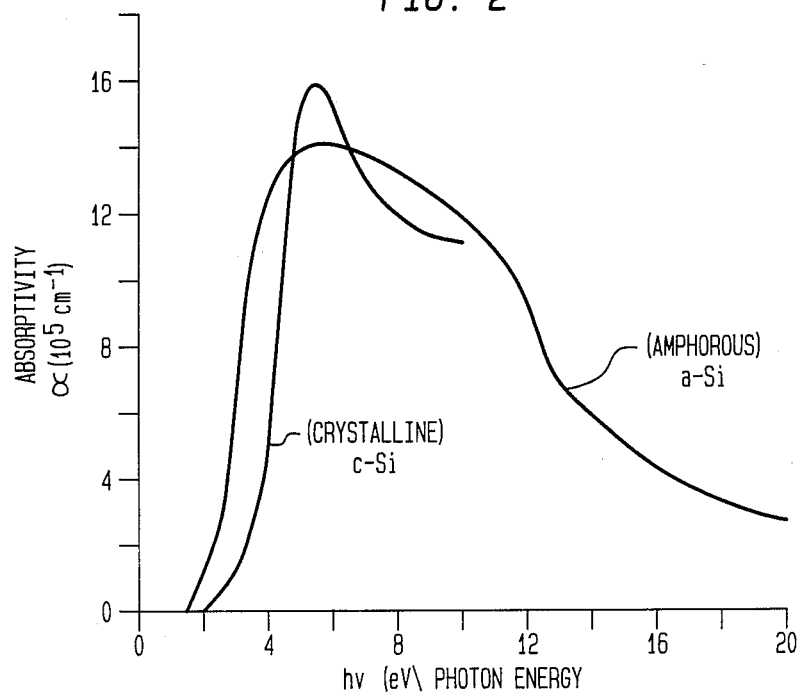
FIG. 2 a diagram which shows the absorptivities of crystalline silicon and amorphous silicon as a function of the energy of optical radiation in electron volts.

It is known that the absorption coefficient of amorphous silicon for light within a predetermined spectral range differs essentially from the absorption coefficient of crystalline silicon, as shown in FIG. 2 for light with a quantum energy up to about 20 electron volts (eV).

The useful spectral region of a c-Si/a-Si photomask is about $$2 \lesssim h\nu \lesssim 4 \text{ eV}$$

or $$620 \text{ nm} \gtrsim \lambda \gtrsim 310 \text{ nm (nanometers)},$$

if a difference by at least a factor 2 of the absorption coefficients of c-Si and a-Si is required. If the thickness d of the silicon layer is properly chosen with respect to the transmission factors of a-Si and c-Si at the wavelength used, a transmission of the crystalline silicon layers of about 50% and a contrast ratio of about 0.85 can be obtained; this is compatible with the present state of the photoresist technique.

EXAMPLE

Quantum energy of the light radiation with which the photomaske is used: 3 eV

Absorption coefficient of c-Si (monocrystalline): $1.3 \times 10^5$ cm$^{-1}$

Absorption coefficient of a-Si: $7 \times 10^5$ cm$^{-1}$

Thickness d of the silicon layer: 50 nm

Transmissivity of c-Si regions: 52%

Transmissivity of a-Si regions: 3%

Contrast ratio: 0.89.

If less stringent conditions are set for the parameters of the exposure, the spectral range useful for the exposure will become correspondingly larger.

Thus, silicon and similar materials with a sufficiently large difference of the absorption coefficients for the crystalline and amorphous phase can be used as photomasks (including reticles and stencils) with light within a relatively large spectral range. The c-Si regions consist preferably of monocrystalline silicon, however, polycrystalline silicon having a sufficiently low content of structural defects may also be used.

FIG. 1 shows also an object 20 to be exposed through the photomask 10. The exemplary object 20 shown in FIG. 1 is a silicon wafer 22, which is provided with a photoresist layer 24 on a main surface which faces the photomask 10. When a homogenerous, collimated beam of violet light 26 is projected through the photomask 10 onto the photoresist layer 24, those portions of the light beam 26 which impinge on the more absorptive a-Si regions 18 are sufficiently absorbed to prevent an exposure of aligned regions 28 of the photoresist layer 24 while the regions 16 which consist of c-Si transmit most of the violet light to the photoresist layer 24 to expose regions 26 aligned with the regions 16. After the exposure the photoresist layer 24 is developed as usual to form an etching mask.

A photomask of the type explained with reference to FIG. 1 can be manufactured quickly and easily by selective irradiation of a thin layer made of crystalline silicon. The irradiation may be effected with intense electromagnetic radiation, such as laser radiation, or alternatively with electron or ion radiation. A very finely focussed irradiating beam can be produced with each of these radiations so that very fine structures with dimensions down to the sub-micron range can be manufactured. The use of an ion beam is preferred since a sufficient modification of the silicon layer within a desired depth can be easily effected by an appropriate selection of the acceleration energy of the ions and the irradiation does. Further, the transformation of the crystalline phase into the armorphous phase is essentially independent of the dose rate. This is not the case with ohter types of radiation, such as electron or laser radiation. However, these latter radiations may also be used if the beam power and irradiation time and rate are appropriately chosen. Conversely, the phase transition from an initially amorphous material to the crystalline state can also be effected, if other beam parameters characteristic to the respective type of radiation are applied.

The process parameters for changing the phase of silicon by an ion beam, more specifically the does, the type of the ions, the energy of the ions (acceleration voltage) and the temperature of the target are kown to those skilled in the art, see e. g. the publication by G. Muller and S. Kalbitzer in Phil. Mag. B41 (1980) 307. It should be emphasized, that it is not always necessary to use mask layers having regions which consits througout of c-Si and regions which consist throughout of a-Si. The modification of a silicon layer which is necessary for a sufficient change of the absorptivity may already be effected with an irradiation dose which is below the threshold value, at which a homogeneous amorphization of the irradiated crystalline mask material occurs. Thus, if desired, a "grey scale", i. e. some type of continuous tone image, can be produced in the photomask. Further, if one starts with a relatively thick c-Si layer, the a-Si regions may extend only to a certain depth into the c-Si layer rather than through the entire thickness of this layer.

Acceleration voltages up to the order of about 100 kilovolts are generally sufficient to convert a silicon layer down to a depth of about 0.1 micrometers. These specific doses for transforming a typical semiconductor material as silicon, from the crystalline phase into the amorphous phase, using ions of medium and heavy atomic weight (atomic mass from about 30 upwards) are about $10^{13}$ to $10^{14}$ particles per square cm. An irradiation with low target temperatures, such as the temperature of liquid nitrogen is generally more effective than an irradiation at room temperature, but not mandatory. Writing times of about $10^{13}$ seconds results for a mask area of 1 cm$^2$ with a dose of $10^{13}$ argon ions per square cm with a beam current of 2 nanoamperes. With a beam spot diameter of 0.1 micrometers, the exposure time is 0.1 microseconds per pixel.

Since amorphous silicon does not recrystallize below temperatues of about 600 degrees centigrade upwards, the a-Si/c-Si patterns produced by irradiation are stable at room temperature for a long period of time.

Figure 3:
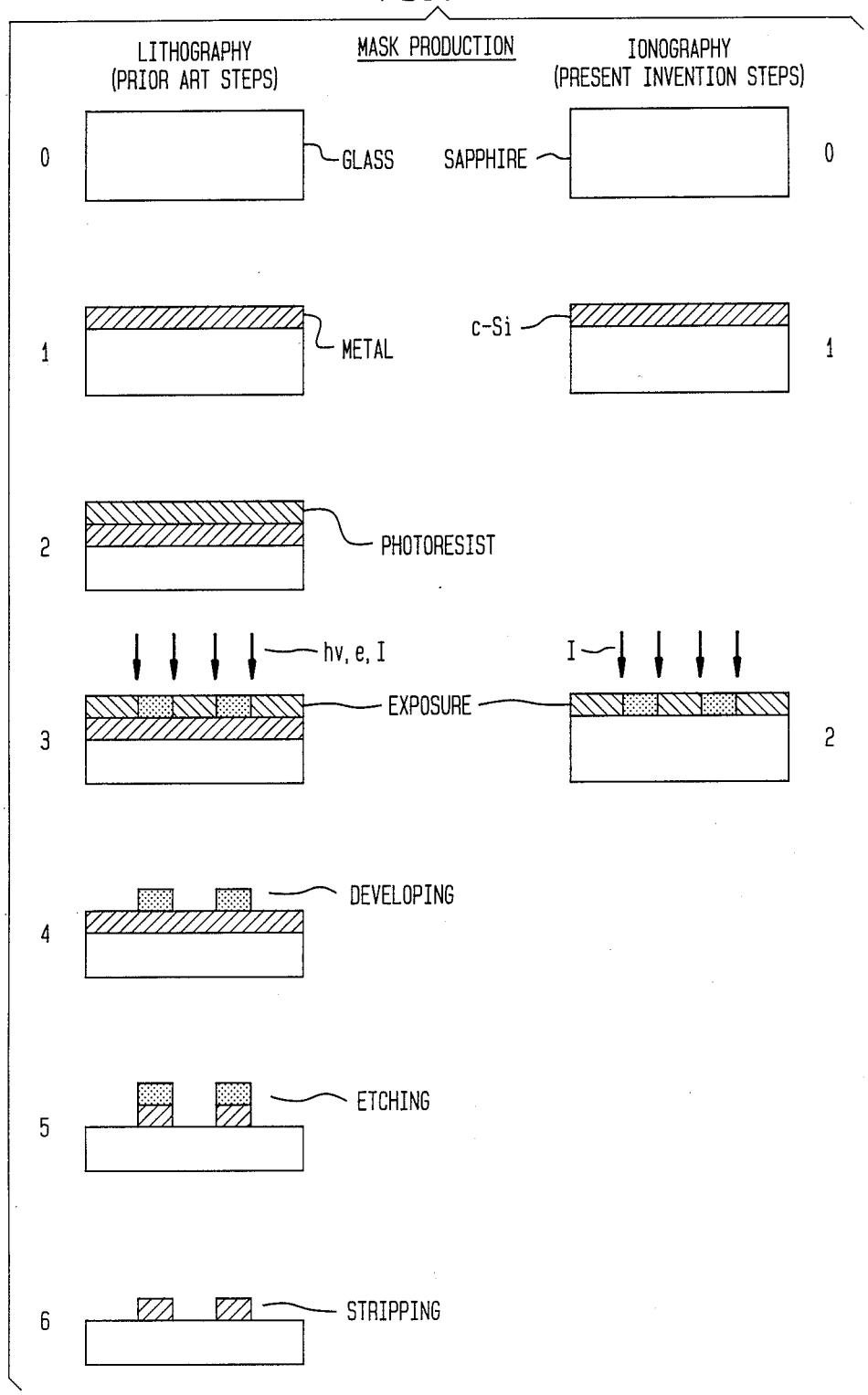
FIG. 3 shows schematically the method steps for producing a photomask by a known photolithographic method and an ionographic method according to an embodiment of the invention.

FIG. 3 show in comparison the method steps for producing a photomask using a known photolithographic method (left side) an the method steps of the preferred ionographic method according to the invention (right side of FIG. 3).

The known method starts from a substrate 0 made of glass which is provided with a metal film in a first method step 1. A photoresist layer is applied to the metal film in method step 2. In method step 3, the photoresist layer is exposed to electromagnetic, electron or ion radiation. The exposed photoresist layer is then developed in method step 4 to produce an etching mask on the metal film. The metal film is selectively etched in method step 5 with a liquid etchant and the remaining photoresist is removed in method step 6.

The method according to the invention starts e. g. from a sapphire substrate, which, in a first method step, is provided with a layer of c-Si having a desired thickness. In a following, second method step the silicon layer is exposed, e. g. by means of a finely focussed ion beam. The photomask is now already ready for use. Sapphire substrates bearing a layer of crystalline silicon (c-Si/Al$_2$O$_3$) are commercially available as "SOS" (silicon on sapphire), thus, only the single step of exposing this silicon layer by means of a radiation beam, preferably an ion beam, remains for producing a photomask according to the invention.

The invention has been described with reference to preferred embodiments thereof. However, various changes and modifications will occur to those skilled in the art. Thus, the photomasks of the invention may be used with light of other wavelengths than as violet light; wavelengths down to the near ultraviolet spectral range are well suited. Also other simiconductor systems with other band gaps may be used. The method of manufacturing a photomask as described above is useful also for other optical proceses for producing fine structures, as diffraction gratings, filters and the like, as well as optical information records or optical information memories.

I claim:

1. A photomask including a layer which comprises regions (16, 18) of different optical transmissivity for optical radiation within a predetermined spectral range, on a substrate (12) which is transparent to the optical radiation with which the photomask is used, characterized in that said layer comprises a semiconductor material which has a crystalline and an amorphous phase, said crytalline phase having a substantially greater optical transmissivity in said predetermined spectral range than said amorphous phase has, said regions each extend far enough through the thickness of said layer that portions (18) of said layer containing more amorphous phase material have absorption coefficients, for optical radiation within said predetermined spectral range, at least a factor of 2 greater than the absorption coefficients of other portions (16) of said layer predominantly containing crystalline material, and that said regions comprise different proportions of said crystalline and amorphous phases of said semiconductor material.

2. A photomask as claimed in claim 1 wherein said semiconductor material is silicon and said regions comprise different proportions of crystalline and amorphous silicon.

3. The photomask as claimed in claim 2, wherein the thickness of said layer is in the order of 0.1 micrometers.

4. The photomask as claimed in claim 2 wherein said silicon layer is supported by a substrate made of sapphire.

5. The photomask as claimed in claim 2 characterized in that some of said regions consist essentially of crystalline silicon.

6. The photomask as claimed in claim 2, wherein some of said regions consist essentially of monocrystalline silicon.

7. The photomask as claimed in claim 2, wherein said mask comprises regions which consist essentially of amorphous silicon.

8. A photomask as claimed in claim 1, wherein the thickness of said layer is selected such that the optical transmissivity of one (16) of said regions is about one half, and the optical transmissivity of the other (18) of said regions is substantially less than half.

9. The photomask of claim 8, wherein the respective optical transmissivities of said regions are selected such that a contrast ratio between said regions of about 0.85 results.

* * * * *